(12) United States Patent
Oh

(10) Patent No.: US 8,634,232 B2
(45) Date of Patent: Jan. 21, 2014

(54) WRITE DRIVER CIRCUIT FOR MRAM, MRAM AND LAYOUT STRUCTURE THEREOF

(75) Inventor: Young Hoon Oh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 13/219,617

(22) Filed: Aug. 27, 2011

(65) Prior Publication Data

US 2012/0257444 A1 Oct. 11, 2012

(30) Foreign Application Priority Data

Apr. 6, 2011 (KR) ........................ 10-2011-0031805

(51) Int. Cl.
*G11C 11/00* (2006.01)

(52) U.S. Cl.
USPC ........................... 365/158; 365/171; 365/173

(58) Field of Classification Search
USPC ......................................... 365/158, 171, 173
See application file for complete search history.

(56) References Cited

U.S. PATENT DOCUMENTS

| | | | |
|---|---|---|---|
| 6,014,281 A * | 1/2000 | Contreras | ........................ 360/67 |
| 7,203,090 B2 | 4/2007 | Hayakawa | |
| 7,224,601 B2 | 5/2007 | Panchula | |
| 7,764,536 B2 * | 7/2010 | Luo et al. | ........................ 365/158 |
| 8,077,501 B2 * | 12/2011 | Ong | ........................ 365/158 |
| 8,077,504 B2 * | 12/2011 | Li | ........................ 365/163 |
| 8,107,280 B2 * | 1/2012 | Yoon et al. | ........................ 365/158 |

FOREIGN PATENT DOCUMENTS

| | | |
|---|---|---|
| JP | 2009-087494 | 4/2009 |
| JP | 2008-269712 A | 11/2009 |
| KR | 1020090029751 A | 3/2009 |
| KR | 1020090119924 A | 11/2009 |
| KR | 1020100098957 A | 9/2010 |

* cited by examiner

*Primary Examiner* — Pho M Luu
(74) *Attorney, Agent, or Firm* — William Park & Associates Patent Ltd.

(57) ABSTRACT

A write driver circuit for a magnetic random access memory includes a memory cell array including a plurality of magnetic memory cells in which a pair of magnetic memory cells adjacent to each other in a direction of a bit line share a source line, and each magnetic memory cell is connected between the bit line and the source line. The write driver circuit includes a switching unit connected between a terminal for supplying a positive recording voltage and a terminal for supplying a negative recording voltage to selectively supply current generated by the positive recording voltage or the negative recording voltage to the bit line according to a write enable signal and a data signal.

17 Claims, 5 Drawing Sheets

US 8,634,232 B2

WRITE DRIVER CIRCUIT FOR MRAM, MRAM AND LAYOUT STRUCTURE THEREOF

CROSS-REFERENCES TO RELATED APPLICATION

The present application claims priority under 35 U.S.C. §119(a) to Korean application number 10-2011-0031805, filed on Apr. 6, 2011, in the Korean Intellectual Property Office, which is incorporated herein by reference in its entirety.

BACKGROUND

1. Technical Field

The present invention relates generally to a semiconductor apparatus, and more particularly, to a magnetic random access memory (MRAM) and a layout structure thereof including a write is driver.

2. Related Art

A dynamic random access memory (DRAM) operates in a relatively high operational speed with relatively low power consumption but is volatile. A flash memory is nonvolatile and can be miniaturized to a size much less than a general hard disc drive as well as made more resistant to physical impact that a hard disc drive, but a flash memory, when compared to a DRAM, operates at a lower speed while requiring a higher operational voltage.

A magnetic random access memory (MRAM) stores digital information utilizing the resistance variation related to polarity change of a magnetic substance and, because magnetism is used, exhibits better reliability.

In general, an MRAM has bit lines, word lines, and digit lines that are parallel to the word lines. An MRAM records data using a vector sum of the magnetic fields that are induced by the current flowing simultaneously through the bit lines and the digit lines. Because digit lines are additionally needed in an MRAM, it poses as a limitation to decreasing the cell size in an MRAM. Also, when recording data by selecting a cell, unselected nearby cells are likely to be exposed to the magnetic fields as well and may wrongly invert the data storage states of the unselected cells.

A spin transfer torque magnetic random access memory (STT-MRAM) is an improved variation of an MRAM.

As indicated in the name, a STT-MRAM utilizes the spin is transfer torque phenomenon that is characterized by, when a high density current having an aligned spin direction is incident on a ferromagnetic substance, the magnetization direction of the ferromagnetic substance aligning with the spin direction of current when the magnetization direction of the ferromagnetic substance does not correspond to the spin direction of current. The STT-MRAM includes one selection transistor and a magnetic tunnel junction (MTJ) which are connected between a bit line and a source line.

FIG. 1 illustrates an exemplary MTJ which is applied to an STT-MRAM generally known in the art.

As illustrated in FIG. 1, a magnetic tunnel junction 1 includes a first electrode layer as a top electrode, a second electrode layer as a bottom electrode, a first magnetic layer and a second magnetic layer as a pair of magnetic layers, and a tunneling barrier layer which is formed between the pair of magnetic layers.

The first magnetic layer may be a free ferromagnetic layer that changes a magnetization direction according to the direction of current applied to the MTJ, and the second magnetic layer may be a pinned ferromagnetic layer having a pinned magnetization direction.

The resistance change of the MTJ, which depends upon the direction of current, is utilized to record "0" or "1" information.

A data recording principle for the MTJ will be described with reference to FIGS. 2a and 2b With reference to FIG. 2a, a principle for recording data of a logic low level (0) in the MTJ will be described. To record data in the MJT in FIG. 2a, the word line WL is enabled, and the selection transistor ST is turned on. Then, as current flows in a direction extending from a bit line BL to a source line SL, that is, as current flows from the first electrode layer as the top electrode of the MTJ to the second electrode layer as the bottom electrode of the MTJ (as indicated by the dotted arrow in FIG. 2a), the magnetization direction of the first magnetic layer as the free ferromagnetic layer and the magnetization direction of the second magnetic layer as the pinned ferromagnetic layer become parallel to each other. As a result, a low resistant state is created, and the data at this time may be defined as having a logic low level (0).

With reference to FIG. 2b, a principle for recording data of a logic high level (1) in the MTJ will be described. Similarly, to record data in the MJT in FIG. 2b, the word line WL is enabled, and the selection transistor ST is turned on. Then, as current flows in a direction extending from the source line SL to the bit line BL, that is, as current flows from the second electrode layer to the first electrode layer (as indicated by the dotted arrow in FIG. 2b), the magnetization direction of the first magnetic layer and the magnetization direction of the second magnetic layer become anti-parallel to each other. As a result, the MTJ has a high resistant state, and the data at this time may be defined as having a logic high level (1).

FIG. 3 illustrates the structure of a cell array of an STT-MRAM generally known in the art, which records data using the bi-directional flow of current as described above with respect to FIGS. 2a-2b.

As illustrated in FIG. 3, source lines SL0 and SL1 and bit lines BL0 and BL1 are aligned parallel to each other, and word lines WL0 and WL1 are aligned perpendicular to the source lines and the bit lines.

A pair of MTJ and selection transistor connected in series between the bit line and the source line to allow current to flow from the bit line to the source line or from the source line to the bit line, so as to record data.

FIG. 4 illustrates the cell array layout of the cell array circuit illustrated in FIG. 3.

As shown in FIG. 4, the MTJ and the selection transistor are formed in an active area 10 to connect to the bit line and the source line in series, and a word line is aligned at a gate terminal of the selection transistor.

In a STT-MRAM having the structure shown in FIG. 4, the unit cell area 12 is $12F^2$ (where F is the word line pitch), and there are limitations to further minimizing the unit cell area 12, mainly because the bit line and the source line are provided in each cell.

FIG. 5 is a circuit diagram of a write driver circuit for an STT-MRAM generally known in the art.

As illustrated in FIG. 5, the write driver circuit includes a first logic element ND1 receiving the inversion signal of a data signal DATA and a write enable signal WREN and outputting a low level signal when the two received signals are at a high level, and a second logic element NR1 receiving the inversion signal of the data signal DATA and the inversion signal of the write enable signal WREN and outputting a high level signal when the two received signals are at a low level.

In addition, the write driver circuit includes a first transistor P1 driven by the output signal of the first logic element ND1 and having a source terminal connected to a power supply voltage terminal VDD, and a second transistor N1 driven by the output signal of the second logic element NR1 and having a drain terminal connected to a drain terminal of the first transistor P1 and a source terminal connected to a ground voltage terminal VSS. Moreover, the write driver circuit includes a third transistor P2 driven by the inverted output signal of the second logic element NR1 and having a source terminal connected to the power supply voltage terminal VDD, and a fourth transistor N2 driven by the inverted output signal of the first logic element ND1 and having a drain terminal connected to a drain terminal of the third transistor P2 and a source terminal connected to the ground voltage terminal VSS.

In order to record data in the STT-MRAM, the write enable signal WREN is activated. When data DATA to be recorded is at a high level, since the output signal of the first logic element ND1 is at a high level and the output signal of the second logic element NR1 is at a high level, the second transistor N1 and the third transistor P2 are turned on, but the first transistor P1 and the fourth transistor N2 are turned off.

As a result, a terminal connected to the bit line BL is at a low level and a terminal connected to the source line SL is at a high level, so that current flows in the direction extending from the source line to the bit line and thus data at a high level is recorded in the MTJ.

When data DATA to be recorded is at a low level, the first transistor P1 and the fourth transistor N2 are turned on, but the third transistor P2 and the second transistor N1 are turned off, so that current flows in the direction extending from the bit line BL to the source line SL and thus data at a low level is recorded in the MTJ.

In the STT-MRAM shown in FIGS. 1-5, the bit line and the source line are aligned in each cell. Therefore, as illustrated in FIG. 4, the unit cell area is $12F^2$, and there are limitations to improving the degree of high integration.

In addition, the current is provided through the write driver circuit as shown in FIG. 5 to record data in each unit cell. That is, the first and second transistor elements P1 and N1 for providing the current to the bit line BL and the third and fourth transistor elements P2 and N2 for providing the current to the source line SL are necessary. Therefore, efficiency is not ensured in terms of current consumption.

SUMMARY

In an embodiment of the present invention, a write driver circuit for a magnetic random access memory, which includes a memory cell array including a plurality of magnetic memory cells in is which a pair of magnetic memory cells adjacent to each other in a direction of a bit line share a source line, each magnetic memory cell being connected between the bit line and the source line, the write driver circuit includes: a switching unit connected between a terminal for supplying a positive recording voltage and a terminal for supplying a negative recording voltage to selectively supply current generated by the positive recording voltage or the negative recording voltage to the bit line according to a write enable signal and a data signal.

In an embodiment of the present invention, a magnetic random access memory includes: a plurality of word lines; a plurality of bit lines vertically aligned to the plurality of word lines; a plurality of common source lines aligned in parallel to the word lines; a memory cell array including a plurality of magnetic memory cells which are connected between the bit lines and the common source lines, respectively; and a write driver circuit connected to the plurality of bit lines.

In an embodiment of the present invention, a layout structure of a magnetic random access memory includes: a plurality of bit lines; a plurality of word lines vertically aligned to the plurality of bit lines; a plurality of common source lines aligned between a pair of the word lines while being parallel to the word lines; and a memory cell array including a plurality of unit magnetic memory cells which are connected between the bit lines and the common source lines and driven by signals applied to the word lines, respectively, wherein the unit magnetic memory cell and a unit magnetic memory cell, which is is adjacent to the unit magnetic memory cell in an extension direction of the bit line, share the common source line.

BRIEF DESCRIPTION OF THE DRAWINGS

Features, aspects, and embodiments are described in conjunction with the attached drawings, in which.

DETAILED DESCRIPTION

Hereinafter, a write driver circuit for a magnetic random access memory (MRAM), an MRAM and a layout structure thereof according to exemplary embodiments of the present invention will be described in detail with reference to the accompanying drawings.

Figure 6:
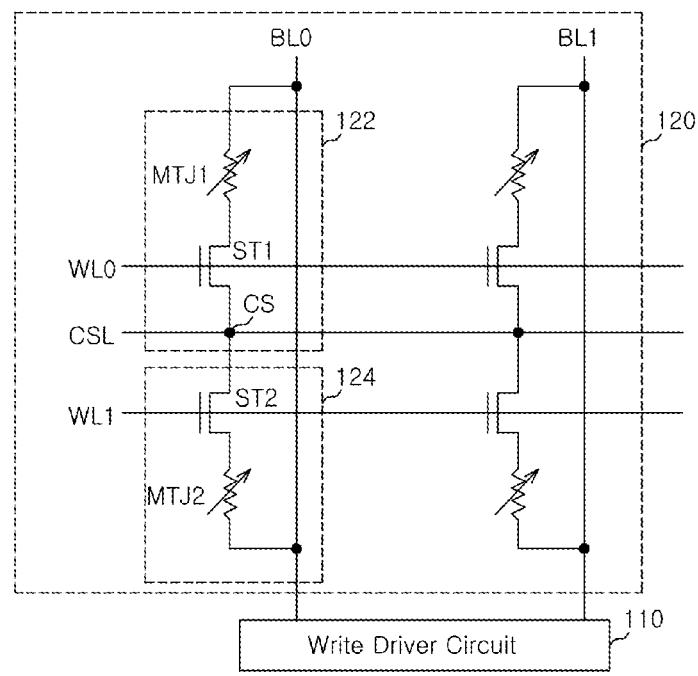
FIG. 6 is a diagram illustrating the structure of a cell array of an MRAM according to an embodiment.

FIG. 6 illustrates a cell array circuit of an MRAM according to an embodiment of the present invention.

As illustrated in FIG. 6, an MRAM 100 according to an embodiment includes a memory cell array 120 having a plurality of unit magnetic memory cells 122 and 124 and a write driver circuit 110 for providing recording current to bit lines of the memory cell array 120.

Each of the unit magnetic memory cells 122 and 124 includes an MTJ and a selection transistor ST that are connected in series between a bit line BL and a common source line CSL or the common source line CSL and the bit line BL, wherein the selection transistor ST is driven by a word line WL. In addition, the pair of memory cells 122 and 124 that are adjacent to each other are formed along the direction in which the bit line BL is extended such that a source line SL is shared by the memory cells 122 and 124 in a common source line (CSL) structure, and the word line WL and the source line SL are aligned in parallel to each other, and the bit line BL is aligned to cross (e.g., perpendicular to) the word line WL and the source line SL.

The structure of the cell array 120 of the MRAM comprising is a pair of memory cells 122 and 124 according to an embodiment of the present invention will be described.

The first magnetic memory cell 122 includes a first magnetic tunnel junction MTJ1 and a first selection transistor ST1 that are connected in series between the bit line BL0 and the common source CS, where the first MTJ1 is connected to a bit line BL0 and the first selection transistor ST1, which is driven by a first word line WL0, is connected to a common source (CS) terminal. The second magnetic memory cell 124 includes a second selection transistor ST2 and a second magnetic tunnel junction MTJ2 connected in series between the bit line BL0 and the common source CS, where the second selection transistor ST2, which is driven by a second word line WL1, is connected to the common source (CS) terminal and the second MTJ2 is connected to the bit line BL0, and the common source line CSL is connected between the common source (CS) terminal and a ground terminal VSS.

Each pair of memory cells 122 and 124 are formed about the common source line CSL such as, for example, resembling a mirror image of each other, and the common source line CSL is aligned in parallel to the word lines WL0 and WL1 but aligned to cross (e.g., perpendicular to) the bit lines BL0 and BL1.

Figure 7:
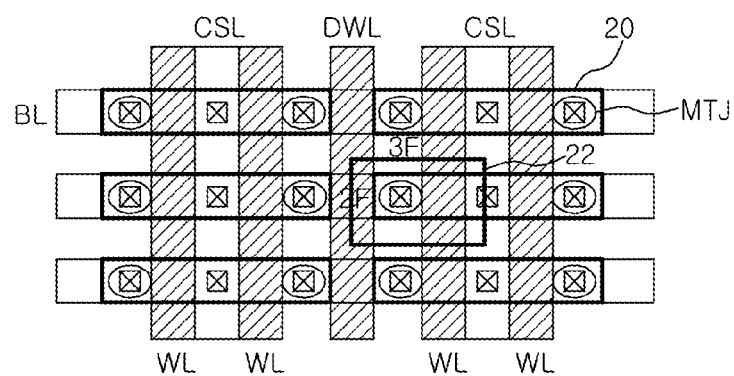
FIG. 7 is a layout diagram of the cell array illustrated in FIG. 6.

FIG. 7 shows a layout of the cell array illustrated in FIG. 6.

In FIG. 7, the common source line CSL is aligned in parallel to the word line WL while perpendicularly aligned to the bit line BL. In addition, a pair of MTJs are aligned about one common source line CSL.

In an embodiment of the present invention, a dummy word line DWL may be formed in a space between two adjacent unit active areas 20. This makes it possible to pattern word lines at a regular interval when forming an interconnection.

Figure 1:
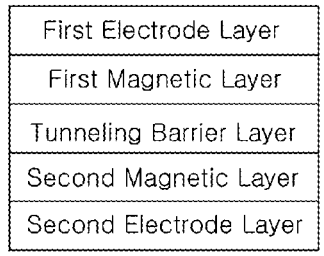
FIG. 1 is a diagram illustrating an exemplary MTJ which is applied to an STT-MRAM generally known in the art.
Figure 2A:
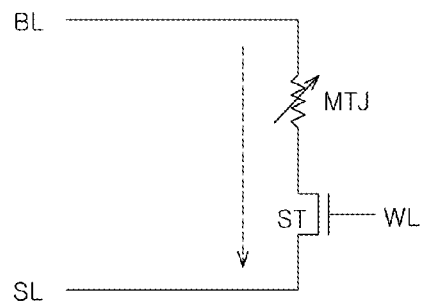
FIGS. 2a and 2b are diagrams explaining a data recording principle for an MTJ.
Figure 2B:
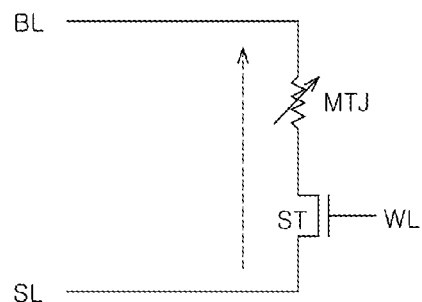
Figure 3:
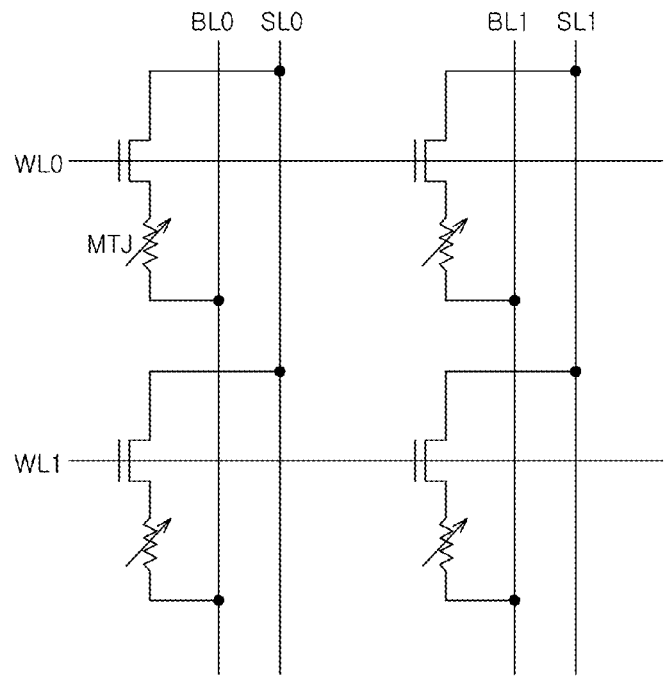
FIG. 3 is a diagram illustrating the structure of a cell array of an STT-MRAM generally known in the art.
Figure 4:
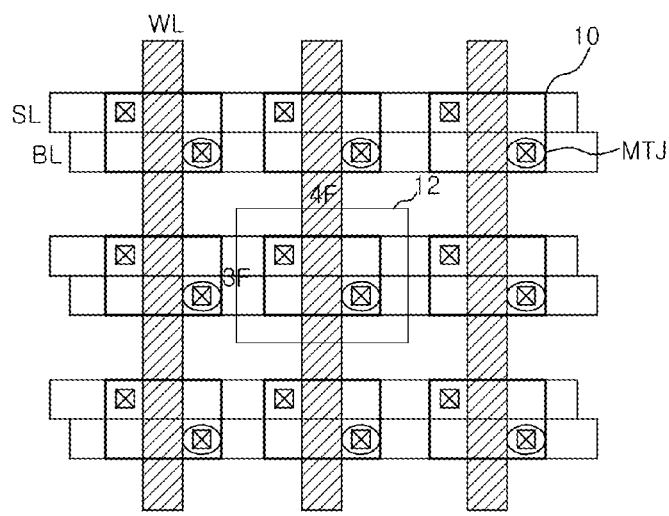
FIG. 4 is a layout diagram of the cell array illustrated in FIG. 3.
Figure 5:
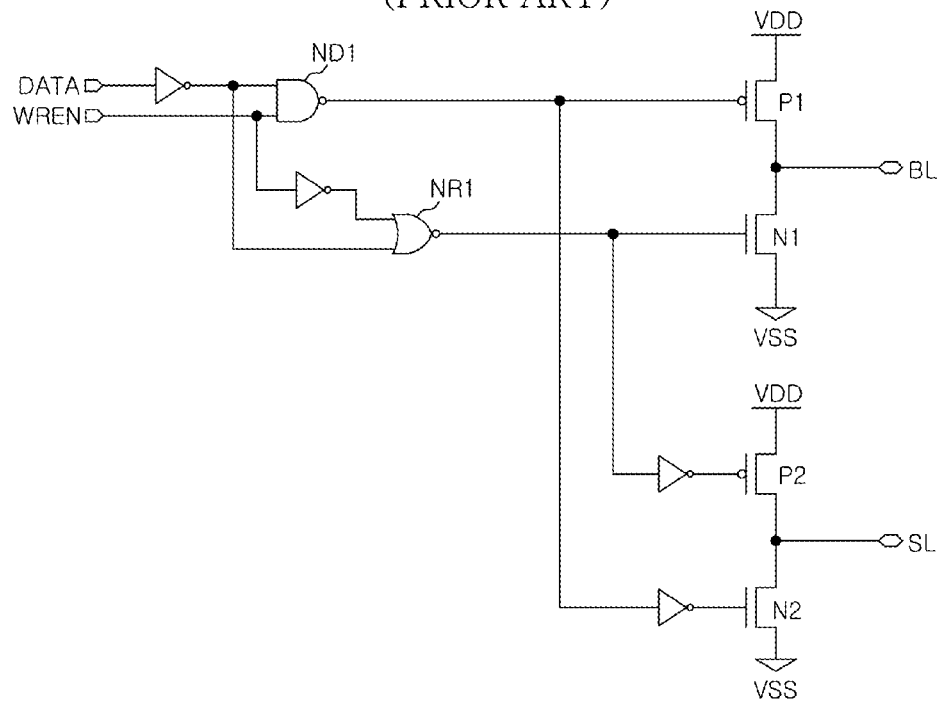
FIG. 5 is a circuit diagram of a write driver circuit for an STT-MRAM generally known in the art.

As a result, the area 22 of a unit magnetic memory cell according to an embodiment of the present invention as shown in FIG. 7 is $6F^2$, and the area efficiency is significantly improved compared to the MRAM illustrated in FIG. 4 having the cell area of $12 F^2$.

In the MRAM illustrated in FIGS. 6 and 7, the common source line CSL is connected to the ground terminal VSS in a data recording operation. Consequently, the write driver circuit supplies current only to the bit line. Furthermore, it is possible to achieve the write driver circuit that supplies a positive (+) recording voltage capable of generating a current flow from the bit line to the source line while being higher than a ground voltage or a negative (−) recording voltage capable of generating the current flow from the source line to the bit line while being lower than the ground voltage in order to control the current flow.

Figure 8:
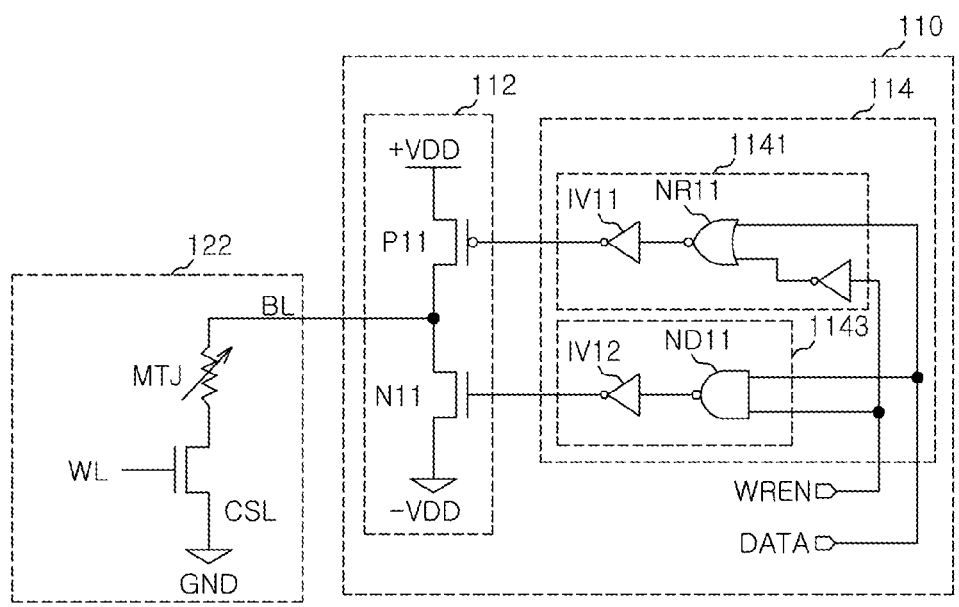
FIG. 8 is a diagram explaining a write driver circuit for an MRAM according to an embodiment.

FIG. 8 illustrates the write driver circuit for the MRAM according to an embodiment of the present invention.

In order to provide a recording current to the bit line BL of the unit magnetic memory cell 122, the write driver circuit 110 according to an embodiment includes a switching unit 112 which is connected between a terminal +VDD for supplying a positive is recording voltage and a terminal −VDD for supplying a negative recording voltage to selectively supply the positive recording voltage or the negative recording voltage according to a write enable signal WREN and a data signal DATA.

In addition, the write driver circuit 110 further includes an input driving unit 114 configured to determine whether to drive the switching unit 112 in response to the write enable signal WREN and the data signal DATA. The input driving unit 114 includes a first driving section 1141 configured to output a first driving signal to the switching unit 112 in response to the data signal DATA and the write enable signal WREN, and a second driving section 1143 configured to output a second driving signal to the switching unit 112 in response to the data signal DATA and the write enable signal WREN. The first driving section 1141 may be configured to output a low level signal when the input signals DATA and WREN are at a low level, and the second driving section 1143 may be configured to output a high level signal when the input signals DATA and WREN are at a high level.

In more detail, the input driving unit 114 includes a first logic element NR11, a second logic element ND11, a first inverter IV11, and a second inverter IV12. The first logic element NR11 is configured to receive the data signal DATA and an inverted signal of the write enable signal WREN and output a high level signal when the received signals are at a low level. The second logic element ND11 is configured to receive the data signal DATA and the write enable signal WREN and output a low level signal when the received signals are at a high level. The first inverter IV11 is configured to invert and drive the output of the first logic element NR11 and the second inverter IV12 is configured to invert and drive the output of the second logic element ND11.

The switching unit 112 includes a first switching element P11 and a second switching element N11. The first switching element P11 is connected between the terminal +VDD for supplying the positive recording voltage and a terminal connected to the bit line BL and driven by the output signal of the first inverter IV11. The second switching element N11 is connected between the terminal connected to the bit line BL and the terminal −VDD for supplying the negative recording voltage and driven by the output signal of the second inverter IV12.

The unit magnetic memory cell 122 is connected to the bit line BL and the common source line CSL, and the ground voltage is applied to the common source line CSL in a recording operation.

When the write enable signal WREN is activated for data recording, the current generated by the positive recording voltage +VDD or the negative recording voltage −VDD is applied to the bit line according to the level of the data signal DATA. The recording voltage, for example, may be supplied using a power supply voltage VDD.

Figure 9:
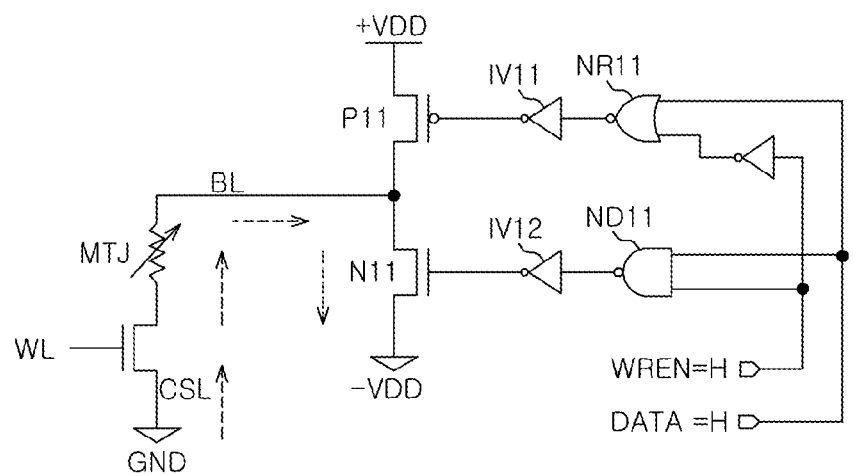
FIGS. 9 and 10 are diagrams explaining a data recording operation in the write driver circuit illustrated in FIG. 8.
Figure 10:
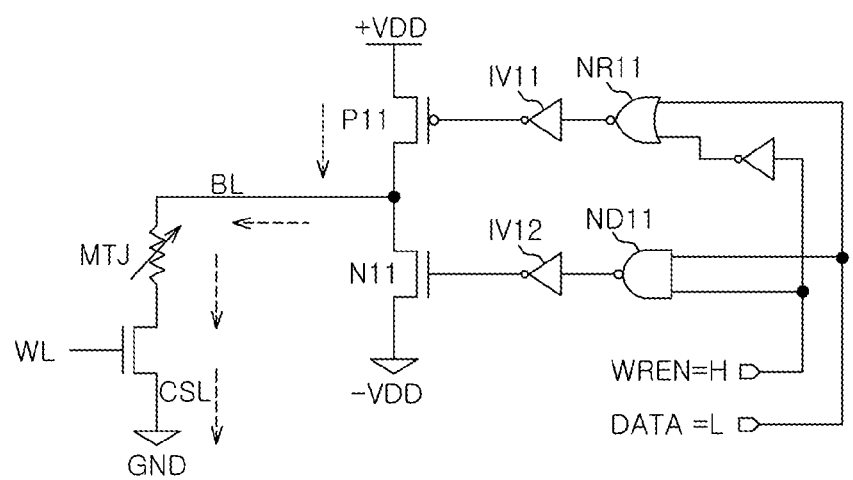

FIGS. 9 and 10 are diagrams for explaining a data recording operation in the write driver circuit illustrated in FIG. 8.

With reference to FIG. 9, the case in which the data of a is high level is recorded in the unit magnetic memory cell.

When the write enable signal WREN and the data signal DATA of a high level are inputted, low level signals are outputted from the first logic element NR11 and the second logic element ND11. Then, the first switching element P11 would turn off, but the second switching element N11 would turn on, so that the current generated by the negative recording voltage −VDD is applied to the bit line BL.

Consequently, the current in the unit magnetic memory cell would flow from the common source line CSL (i.e., the ground terminal VSS) to the bit line BL as indicated by the dotted arrows in FIG. 9, and the magnetization direction of the first and second magnetic layers of the MTJ would become anti-parallel to each other. This will cause the MTJ to have a high resistant state, and thus the data of a high level would be recorded.

With reference to FIG. 10, the case in which the data of a low level is recorded in the unit magnetic memory cell. In such a case, the write enable signal WREN at a high level and the data signal DATA at a low level are inputted to the input driving unit.

Then the high level output signals would be outputted from the first logic element NR11 and the second logic element ND11, which would turn on the first switching element P11 but turn off the second switching element N11.

Then, the current generated by the positive recording voltage +VDD would be applied to the bit line BL, so that the current would flow from the bit line BL to the common source line CSL (i.e., the ground terminal VSS) in the unit magnetic memory cell. As a result, the current would flow from a first electrode layer (a top electrode of the MTJ) and a second electrode layer (a bottom electrode of the MTJ) as indicated by the dotted arrow, and the magnetization direction of the first magnetic layer (a free ferromagnetic layer) and the magnetization direction of the second magnetic layer (a pinned ferromagnetic layer) become parallel to each other, so that a low resistant state is created and thus data at a low level is recorded.

In an embodiment of the present invention, the source line is connected to the ground terminal in a data recording operation. Consequently, the recording current is applied only to the bit line, so that it is possible to exclude elements for applying the recording current to the source line from the write driver circuit. As a result, it is possible to reduce the area occupied by the write driver circuit and minimize the amount of recording current consumption.

While certain embodiments have been described above, it will be understood to those skilled in the art that the embodiments described are by way of example only. Accordingly, the write driver circuit for an MRAM, the MRAM and the layout structure thereof described herein should not be limited based on the described embodiments. Rather, the write driver circuit for an MRAM, the MRAM and the layout structure thereof described herein should only be limited in light of the claims that follow when taken in conjunction with the above description and accompanying drawings.

What is claimed is:

1. A write driver circuit for a magnetic random access memory comprising a memory cell array comprising a plurality of magnetic memory cells, each of the magnetic memory cells being connected between a bit line and a source line, a pair of magnetic memory cells adjacent to each other in an extension direction of the bit line is configured to share the source line, the write driver circuit comprising:

a switching unit connected between a terminal for supplying a positive recording voltage and a terminal for supplying a negative recording voltage, and configured to selectively supply current generated by the positive recording voltage or the negative recording voltage to the bit line connecting the magnetic memory cell according to a write enable signal and a data signal so as to influence the resistance state of the magnetic memory cell wherein an output node of the switching unit is configured to be connected to the bit line.

2. The write driver circuit according to claim 1, further comprising:

an input driving unit configured to determine whether to drive the switching unit in response to the write enable signal and the data signal.

3. The write driver circuit according to claim 2, wherein the input driving unit comprises:

a first driving section configured to output a first driving signal to the switching unit in response to the data signal and the write enable signal; and a second driving section configured to output a second driving signal to the switching unit in response to the data signal and the write enable signal.

4. The write driver circuit according to claim 3, wherein the first driving section is configured to output a low level signal when the data signal and the write enable signal are at a low level, and the second driving section is configured to output a high level signal when the data signal and the write enable signal are at a high level.

5. A magnetic random access memory (MRAM) comprising one or more bit lines, word lines, and common source lines, the MRAM comprising:

a memory cell array comprising two or more magnetic memory cells connected between a bit line and a common source line, a pair of magnetic memory cells adjacent to each other in an extension direction of the bit line is configured to share the common source line; and a write driver circuit comprising an output node connected to the bit line, and configured to control a current flow direction in the bit line of the magnetic memory cell, so as to affect the resistant state of the magnetic memory cell.

6. The magnetic random access memory according to claim 5, wherein two magnetic memory cells are connected to the common source line and wherein components in each of the two unit magnetic memory cells are connected in a mirror image of each other with respect to the common source line.

7. The magnetic random access memory according to claim 6, wherein the two magnetic memory cells comprise:

a first memory cell comprising a first magnetic tunnel junction and a first selection transistor connected in series between the bit line and the common source line; and a second memory cell comprising a second selection transistor and a second magnetic tunnel junction connected in series between the common source line and the bit line.

8. The magnetic random access memory according to claim 5, wherein the write driver circuit is configured to provide a recording current to the bit line in order to record data in the magnetic memory cell, and a ground voltage is provided to the common source line in a data recording operation.

9. The magnetic random access memory according to claim 8, wherein the write driver circuit comprises:

a switching unit configured to provide either a positive recording voltage or a negative recording voltage to the bit line of the magnetic memory cell so as to selectively produce the current generated by the positive recording voltage or the negative recording voltage in the bit line according to a write enable signal and a data signal.

10. The magnetic random access memory according to claim 9, wherein the write driver circuit further comprises:

an input driving unit configured to determine whether to drive the switching unit to either the positive or negative recording voltage in response to the write enable signal and the data signal.

11. The magnetic random access memory according to claim 10, wherein the input driving unit comprises:

a first driving section configured to output a first driving signal to the switching unit in response to the data signal and the write enable signal; and a second driving section configured to output a second driving signal to the switching unit in response to the data signal and the write enable signal.

12. The magnetic random access memory according to claim 11, wherein the first driving section is configured to output a low level signal when the data signal and the write enable signal are at a low level, and the second driving section is configured to output a high level signal when the data signal and the write enable signal are at a high level.

13. A magnetic random access memory, comprising:
a plurality of bit lines in a first direction;
a plurality of word lines in a second direction, wherein the first and second directions are not parallel;
a plurality of common source lines aligned in the second direction between a pair of the word lines; and
a memory cell array comprising two unit magnetic memory cells, each of which is connected between one of the bit lines and one of the common source lines and is driven by a signal applied to the word line connected to the memory cell,
wherein the two unit magnetic memory cells are formed to be adjacent to each other in the first direction, and one of the adjacent magnetic memory cells is connected between any one of the bit lines and any one of the common source lines and the other of the adjacent magnetic memory cells is connected between said any one of the common source lines and said any one of the bit lines.

14. The magnetic random access memory according to claim 13, wherein components of each of the two memory cells are connected between the bit line and the common source line but in a manner resembling a mirror image of each other with respect to the common source line.

15. The magnetic random access memory according to claim 14, wherein the pair of memory cells sharing the common source line are formed on a same active area, and a dummy word line is further formed between adjacent active areas in a direction parallel to the word line.

16. The magnetic random access memory according to claim 14, wherein the components of each memory cell comprise a magnetic tunnel junction and a selection transistor connected in series.

17. The magnetic random access memory according to claim 16, wherein the resistance state of the magnetic tunnel junction is determined by the current flow direction through the magnetic tunnel junction between the bit line and the common source line.

* * * * *